United States Patent [19]

Abell

[11] Patent Number: 4,766,517

[45] Date of Patent: Aug. 23, 1988

[54] AVIONIC TRAY OF DECREASED WEIGHT

[76] Inventor: Robert H. Abell, 7415 Crescent Ave., Buena Park, Calif. 90620

[21] Appl. No.: 43,507

[22] Filed: Apr. 28, 1987

[51] Int. Cl.$^4$ .............................................. H05K 7/20
[52] U.S. Cl. ................................... 361/383; 138/173; 220/72
[58] Field of Search .................. 248/27.1; 211/41, 72, 211/135; 361/382, 383, 384, 392, 393; 206/328, 332, 449, 455; 138/173; 220/72

[56] References Cited

U.S. PATENT DOCUMENTS

| | | | |
|---|---|---|---|
| 985,738 | 2/1911 | Foster | 138/173 |
| 3,640,141 | 2/1972 | Hollingsead | 74/89.15 |
| 3,688,803 | 9/1972 | Pavia | 138/173 |
| 3,710,476 | 1/1973 | Hollingsead | 248/27.1 |
| 3,771,023 | 11/1973 | Hollingsead | 361/383 |
| 4,044,515 | 8/1977 | Hollingsead | 361/383 |
| 4,458,296 | 7/1984 | Bryant | 361/383 |

*Primary Examiner*—G. P. Tolin
*Attorney, Agent, or Firm*—Jackson & Jones

[57] ABSTRACT

An avionic tray adapted to be made in several width and sizes including standard ATR widths is made from aluminum alloy sheet which had beads or corrugations to compensate for decreased overall width of the sheet. Typically, the sheet is made from 0.040" thick 6061-T6 aluminum alloy, and the beads or corrugations increase the effective apparent thickness of the sheet to the usual tray thickness of 0.063". In a bottom section of the tray the beads run substantially parallel with the longitudinal axis of the tray, but do not extend to a deformed area where a metering plate is mounted. In side rails of the tray one bead runs parallel with the longitudinal axis, and the rest of the beads are disposed parallel with an edge of the side rail which is itself at an acute angle to the longitudinal axis of the tray. Jig pins provided in the side rails of the tray comprise extrusions of the material of the side rail which surround punched-out holes in the material.

21 Claims, 2 Drawing Sheets

AVIONIC TRAY OF DECREASED WEIGHT

BACKGROUND OF THE INVENTION

1. Field of the Invention

The present invention is directed to avionic racking trays. More particularly, the present invention is directed to avionic racking trays of lightweight construction.

2. Brief Description of the Prior Art

Avionic racking trays have been known in the art for a long time. More particularly, in accordance with the usual practice in the aircraft building industry, each piece of electronic equipment used in aircraft is contained in a separate container ("black box") which is supported by an individual tray. The trays are, in turn, mounted substantially at their respective front and back ends on cross beams provided in the aircraft. The trays are usually made in standard ATR (aircraft tray racking) widths to accommodate various sizes of instruments.

The trays are usually mounted above a plate attached to the cross beams, so that the plate and the bottom sections of the trays jointly form an air plenum. Air is usually continuously evacuated from the air plenum. The trays usually have a depressed central portion into which a separate metering plate, having one or more air metering holes, is mounted, surrounded by a gasket.

The usual avionic racking trays include vertical side rails disposed at the lateral edges of a substantially horizontally disposed base plate of the tray. Still in accordance with standard practice in the art, a back plate is mounted with fasteners (such as bolts and nuts) between the side rails. The back plate has one or more openings or cut-out portions into which electrical connectors are mounted. Female receptacles of these connectors receive a plurality (usually a multitude) of male electrical connector pins which extend outwardly from the electronic equipment.

The safety of aircraft and its passengers often depends on the safe and reliable operation of various electronic equipment. To ensure such reliability the following aspects of the avionic racking trays and of the associated hardware were particularly recognized in the prior art.

The back plate must be disposed precisely at a right angle relative to the base plate of the tray in order to enable the male pins of the electronic equipment to engage matching female receptacles in the electric connector mounted to the base plate. Attaching the back plate to the side rails by ordinary nuts and bolts, however, does not provide sufficient precision for this purpose. As is described in detail in U.S. Pat. No. 3,710,476 this problem is solved in the prior art by providing jig pins in the interior sides of the side rails. The back plate is then provided with holes to register with the jig pins to provide a self-aligning assembly, which is fastened together by bolts and nuts, or other like fastener means.

Accurate mounting of the container for the electronic equipment (black box) into the tray for proper alignment of the male pins with the female receptacles is also important. At the same time it is highly desirable to establish sealing contact between the black box and the rubber or like gasket which holds the air metering plate in the tray. When these two related requirements are met, as in the structures described in U.S. Pat. No. 3,771,023, then air flows through an opening in the black box, through the metering hole in the metering plate, into the air plenum, and usually adequately cools the electronic equipment.

Still another important requirement recognized in the prior art relates to the manner the electronic equipment is inserted and removed from the tray. To maintain the multitude of male connector pins at all times substantially perfectly in alignment with the multitude of matching female connector receptacles, the prior art has devised an extractor and hold-down spindle which is described in U.S. Pat. No. 3,640,141.

A hitherto unsolved problem of avionic racking trays relates to weight. Up to the present invention, standard avionic trays have been made from 0.063" thick sheets of aircraft quality aluminum alloy, usually 6061-T6 (or equivalent) aluminum alloy. Those skilled in aluminum alloy metallurgy readily recognize that 6061 is a designation for the alloy which denotes the composition of the alloy, and that T6 is a designation which denotes a particular type of standard heat treatment given to the alloy.

Even though aluminum alloy 6061-T6 is structurally strong, it has been generally accepted in the art that the tray must be made of at least approximately 0.063" thick sheets. In fact, the ATR standard which has evolved in the aircraft industry is, by-and-large, based on the accepted fact that wall thickness of the standard trays is approximately 0.063". Nevertheless, reduction in weight of equipment incorporated into aircraft is always highly desirable. Therefore, there is a significant advantage to be gained in the art by reducing the weight of standard avionic trays. The present invention accomplishes this weight reduction without adversely affecting the structural strength or other advantageous properties of prior art avionic trays.

SUMMARY OF THE INVENTION

It is an object of the present invention to provide an avionic tray which has significantly reduced weight compared to prior art avionic trays of the same overall dimensions, and which nevertheless has the same structural strength.

The foregoing and other objects and advantages are attained by an avionic tray which includes a bottom section made from aluminum alloy sheet and a pair of side rails of unitary construction with the bottom section, each one of the side rails extending upwardly at lateral edges of the bottom section. At least the bottom section of the trays includes corrugations or beads which comprise offsets where the aluminum alloy plate of the sheet on one side of the bead is offset relative to the alloy plate of the other side of the same bead.

The beads or corrugations increase the effective apparent thickenss and the actual overall strength of the aluminum alloy sheet. For this reason, instead of the customarily accepted 0.063" thick aluminum alloy sheet, the trays of the present invention can be made, for example, from aluminum alloy sheets of approximately 0.040" thickness. The use of thinner sheets in accordance with the invention significantly reduces the weight of the trays. The beads or corrugations nevertheless provide an effective apparent thickness of approximately 0.063" to the sheet of the trays, so as to render the trays interchangeable with customarily used avionic trays.

The features of the present invention can be best understood, together with further objects and advantages, by reference to the following description taken together with the accompanying drawings.

DESCRIPTION OF THE PREFERRED EMBODIMENT

The following specification taken in conjunction with the drawings sets forth the preferred embodiment of the present invention. The embodiment of the invention disclosed herein is the best modes contemplated by the inventor for carrying out his invention in a commercial environment, although it should be understood that various modifications can be accomplished within the parameters of the present invention.

Figure 1:
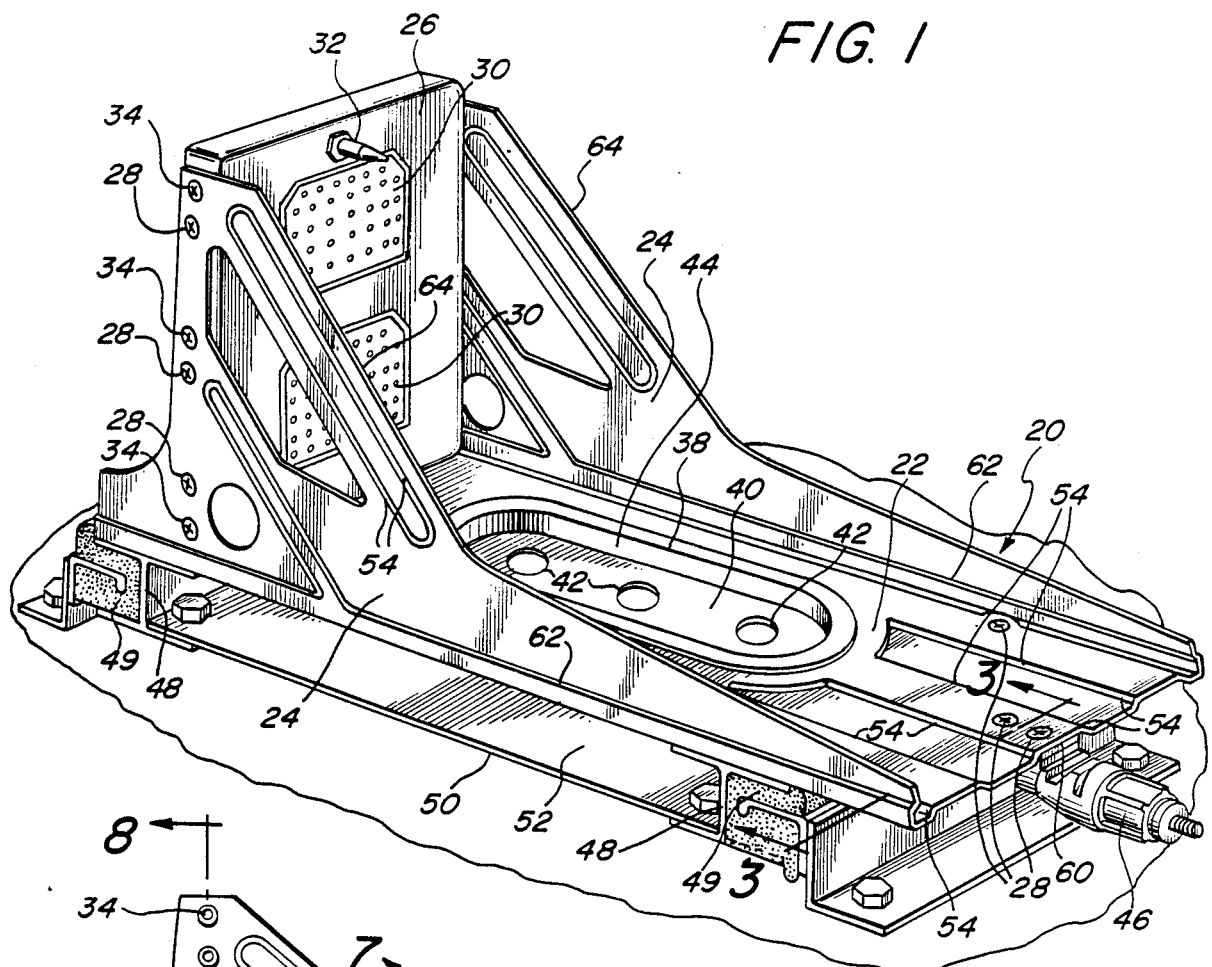
FIG. 1 is a perspective view of a preferred embodiment of the avionic tray of the present invention, the perspective view showing a back plate, electric connector receptacles, and an extractor hold-down device mounted to the tray.

Referring now to FIGS. 1-9 of the appended drawings, and particularly to the perspective view of FIG. 1, a preferred embodiment of the avionic racking tray, or avionic tray 20, of the present invention is disclosed. As it will be readily understood by those skilled in the art, the avionic tray 20 of the present invention can be made in various widths and sizes, including the various standard ATR widths.

The avionic tray 20 of the present invention has certain features in common with the avionic trays of the prior art. These common features are described in this specification only to the extent necessary to describe and explain the present invention.

More specifically, the avionic tray 20 of the present invention includes a generally rectangular base of bottom plate 22. A pair of side rails or vertical uprights 24 are connected to the base plate 22. The uprights 24 support a back plate 26 which is mounted to the uprights 24 by a plurality of recessed bolts 28. The back plate 26 receives electrical connector sockets 30. The sockets 30, in turn, receive the male connector pins (not shown) of electronic equipment (not shown) which is mounted to the tray 2. Perhaps because it is customary in the industry to mount the electronic equipment into a rectangular box, the electronic equipment supported by the tray 20 is sometimes referred to in the trade, and in the ensuing description, as a "black box". As a standard feature well known in the art, the back plate 26 includes a spring loaded guide pin 32 which helps to guide and maintain the "black box" (not shown) in proper position in the tray 20. In alternative embodiments of the invention (as in the prior art as well) more than one guide pin may be used.

The vertical uprights 24 of the preferred embodiment include jig pins 34. The back plate 26 includes a plurality of holes disposed to register with the jig pins 34, which insure precisely vertical alignment of the back plate 26 relative to the bottom or base plate 22. The jig pins 34 and the registering holes used in the present invention are an improvement of the jig pins and registering holes described in U.S. Pat. No. 3,710,476, the specification of which is expressly incorporated herein by reference.

The bottom or base plate 22 of the preferred embodiment of the avionic tray 20 of the present invention includes a substantially oval-shaped depressed or deformed area 38 which surrounds a similarly shaped opening in the base plate 22. A metering plate 40 having a plurality of air metering holes 42 is mounted into the deformed area 38 with the help of a resilient gasket 44. Further and accurate details of the gasket 44 and of the metering plate 40, their construction, operation, and advantages are described in U.S. Pat. No. 3,771,023, the specification of which is incorporated herein by reference.

Referring now exclusively to FIG. 1, an extractor and hold-down spindle 46 is shown attached to the front of the avionic tray 20. The structure and function of the extractor and hold-down spindle 46 is described in U.S. Pat. No. 3,640,141, the specification of which is also incorporated herein by reference. For the purposes of the present description, it is believed to be sufficient to note that the spindle 46 pushes the black box (not shown) into the position wherein the male connectors (not shown) engage the sockets 30. The extractor hold-down spindle 46 also holds down the front of the black box (not shown) when the black box is mounted to the tray 20, and assists in removing the electronic equipment (black box) from the tray 20 without bending or damaging the male connector pins (not shown).

FIG. 1 further illustrates a pair of cross-beams 48 in the aircraft to which the avionic tray 20 is mounted. A resilient gasket 49 is mounted below the cross-beam 48 to lend resilient support. A plate 50 is affixed to the cross-beams 48 and forms a lower boundary of an air plenum chamber 52. It should be understood in this connection that a plurality of avionic trays 20 are mounted side-by-side to the cross-beams 48 above the plate 50, and usually a thin resilient gasket (not shown) is placed between adjacent trays 20. The trays 20 mounted adjacent to one another jointly comprise the upper boundary of the air plenum chamber 52. The air which is continuously evacuated from the chamber 52 is resupplied to the chamber 52 substantially only through the metering holes 42. Flow of the air to the metering holes 42, in turn, passes through perforations (not shown) in the walls (not shown) of the black boxes (not shown), effectively cooling the electronic equipment (not shown) which is inside.

An important novel feature of the present invention is that the avionic tray 20 is constructed from an aluminum alloy sheet which is significantly thinner and therefore lighter than the aluminum alloy sheet used in the prior art.

In the prior art it is usual practice to construct avionic trays from 6061-T6 aluminum alloy sheets of 0.0063" thickness.

In accordance with the present invention the trays 20 are preferably made form 6061-T6 aluminum alloy sheets of approximately 0.040" thickness. In this connection it is noted that the 6061 designation for the aluminum alloy for making the avionic trays 20 is well known in the art, and designates the composition of the alloy. The designation T6 indicates the specific type of heat treatment to which the trays 20 are subjected to attain their final hardness and structural integrity.

Figure 2:
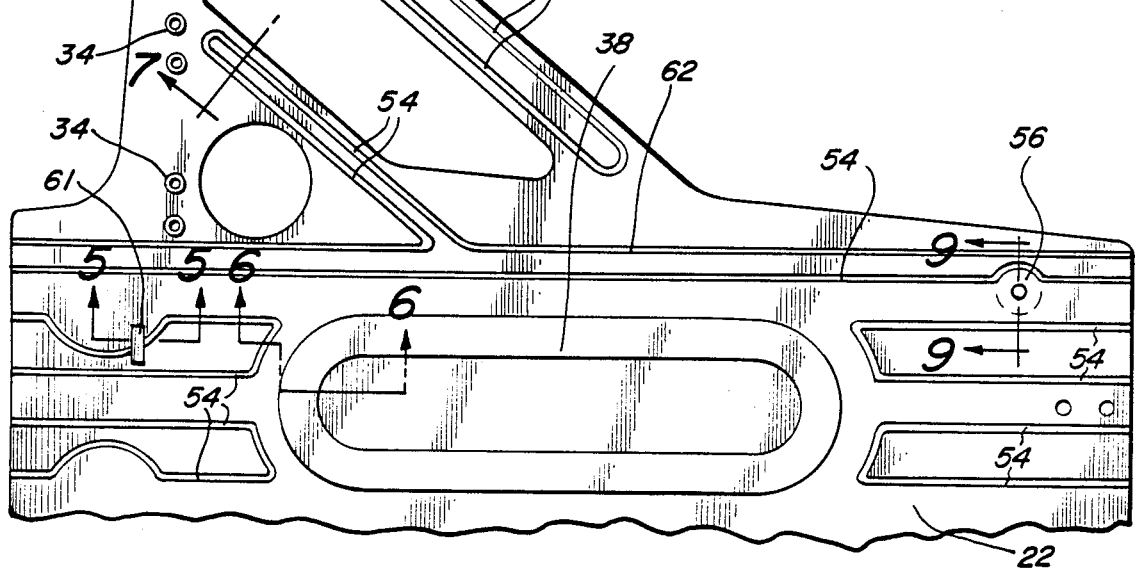
FIG. 2 is a flat pattern of the preferred embodiment of the avionic tray.
Figure 3:
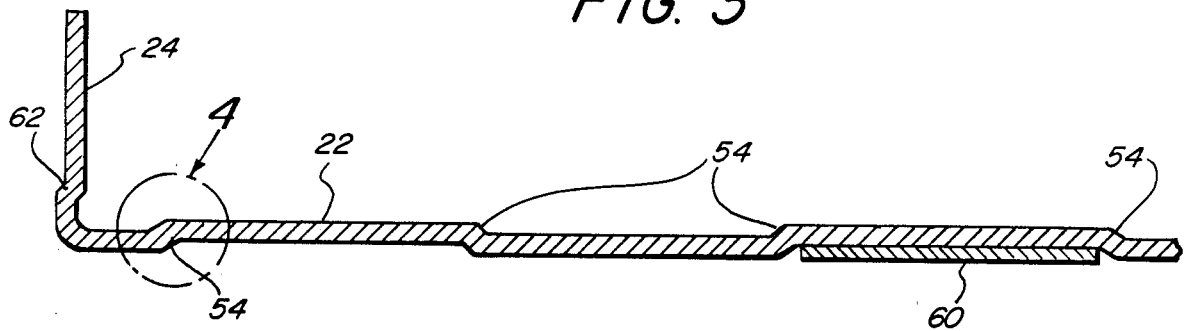
FIG. 3 is a cross-sectinal view, the cross-section being taken on lines 3,3 of FIG. 1.
Figure 4:
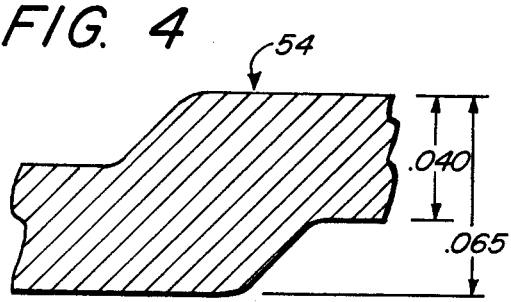
FIG. 4 is an enlarged view of the area indicated with 4 on FIG. 3.

Referring now to FIGS. 1, 2, 3, 4, and 7 and primarily to FIG. 4, beads or corrugations 54 are shown incorporated into the aluminum alloy sheet of the tray 20. As it will be well understood by those skilled in the art, the beads or corrugations 54 comprise a vertical offset of the material of the sheet. The beads or corrugations 54 within the scope of the present invention preferably offset the sheet less than the overall thickness of the sheet itself. Preferably, and as is illustrated on FIG. 3, the 0.040" thick sheet material of the tray 20 is offset approximately 0.025" so as to give an overall "apparent" or combined thickness of 0.065" to the sheet. However, because the aluminum alloy of the sheet has certain inherent elasticity, the effective apparent thickness of the sheet is approximately 0.063", which is the usual thickness of avionic trays.

The beads or corrugations 54 provide additional strength to the aluminum sheet metal of the tray 20 of the invention. Consequently, the tray 20 made of the thinner (0.040" thick) sheet in accordance with the present invention still has approximately the same (or even greater) strength as prior art tray made of 0.063" thick sheets of the same aluminum alloy. Nevertheless, the weight of the trays of the present invention is approximately ⅓ less than the weight of comparable prior art trays.

In accordance with the present invention the beads or corrugations 54 are provided in the base or bottom plate 22 of the tray 20, and the beads 54 are disposed parallel with the general longitudinal axis of the tray 20. At least two, and preferably more, beads 54 are provided in the bottom plate 22. The beads 54, however, do not extend to the depressed or deformed area 38 into which the metering plate 40 is mounted. This is shown in the cross-sectional view of FIG. 6.

Generally speaking, in accordance with the present invention the beads 54 are spaced preferably no more than 0.60" further apart from one another in the bottom plate 22. The actual lay-out of the beads 54, however, is also affected by the requirement that the beads 54 preferably should not be in an area of the tray 20 where there is an aperture 56 to accommodate a bolt 28. Inasmuch as the spacing of apertures 56 in the bottom plate 22 of the tray 20 is often mandated by varying requirements of aircrcaft manufacturers, the beads 54 are incorporated into the tray 20 so as to avoid such apertures 56. This is best shown on FIGS. 1 and 2. FIG. 2 depicts a flat pattern of the tray 20 before the side rails 24 are folded up at right angles in an appropriate form die (not shown).

Figure 9:
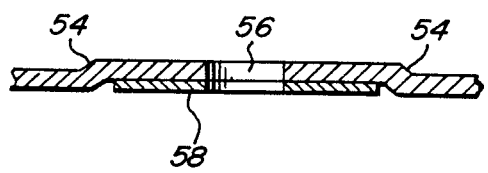
FIG. 9 is still a further cross-sectional view taken on lines 9.9 of FIG. 2.

FIGS. 2 and 9 indicate that a round reinforcing plate or "doubler strip" is mounted under the bottom plate 22 of the tray 22 in the area where the tray 20 is attached to the cross-beam 48 with screws 28. The heads of the screws 28 are recessed as is shown in the drawing Figures. A similar reinforcing plate or doubler strip 60 is disposed below the bottom plate 22 where the bottom plate 22 is mounted to the extractor hold-down spindle 46. This is shown on the cross-sectional view of FIG. 3. Preferably in accordance with the present invention, the reinforcing plates or doubler strips 58 and 60 are configured and mounted in such a manner that they do not straddle any beads 54, thereby avoiding a flattening force on the beads when the overlaying bolt or screw 28 is tightened.

Figure 5:
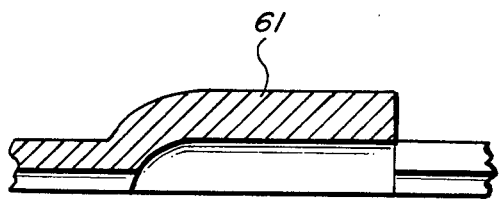
FIG. 5 is a cross-sectional view taken on lines 5,5 of FIG. 2.
Figure 6:
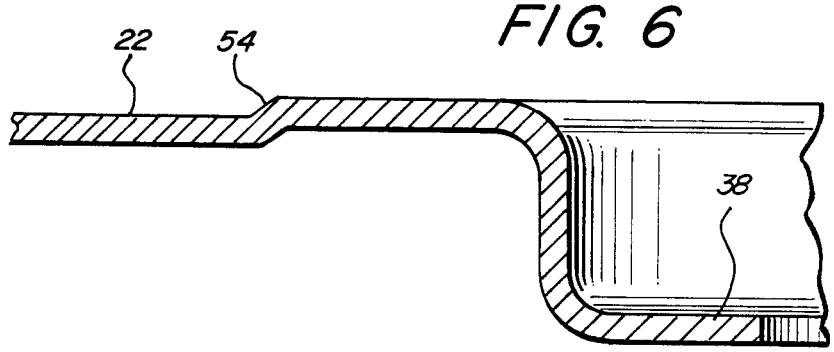
FIG. 6 is another cross-sectional view taken on lines 6,6 of FIG. 2.

FIGS. 2 and 5 show a protrusion 61 formed in the bottom plate 22 which assists in accurately positioning the back plate 26 in the tray 20 between the side rails 24.

Figure 7:
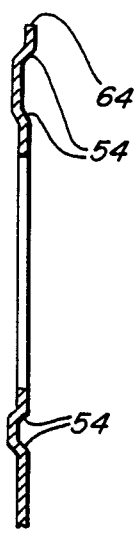
FIG. 7 is still another cross-sectional view taken on lines 7,7 of FIG. 2.

Referring now specifically to FIGS. 1, 2, and 7, the side rails or uprights 24 of the preferred embodiment are shown to also include a plurality of beads 54. One bead in the position most proximate to the bottom of the side rail 24 runs substantially parallel with the longitudinal axis of the tray 20. This bead, which bears the reference numeral 62, and is best discernible on FIG. 3, is important for the structural integrity of the tray 20.

The remaining beads 54 of the side rails 24, however, are not disposed substantially parallel with the longitudinal axis of the tray 20. Rather, the beads 54 of the side rails 24 are disposed at an acute angle relative to the longitudinal axis, so as to run substantially parallel with the edge 64 of the side rail 24. It has been found in experience that the above-described layout of the beads 54 provides significant increase in the structural integrity of the tray 20.

Figure 8:
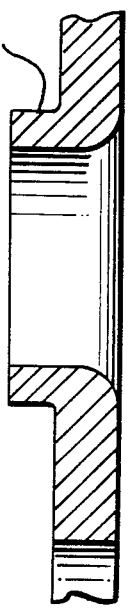
FIG. 8 is yet another cross-sectional view taken on lines 8,8 of FIG. 2.

FIGS. 2 and 8 show a jig pin 34 incorporated into the side rail 24. The function of the jig pins 34 and of registering holes in the back plate 26 has been described above in connection with the specific incorporation by reference of U.S. Pat. No. 3,710,476. The jig pins 34 of the tray 20 of the present invention comprise an extrusion of the material of the side rail 24 to approximately 0.030 to 0.040", and a hole formed by the extrusion. FIGS. 2 and 8 also show holes 66 in the side rails 24 into which the bolts 28 holding the back plate 26 to the side rails 24 are mounted.

Several modifications of the above-described avionic tray of the present invention may become readily apparent to those skilled in the art in light of the foregoing disclosure. Particularly apparent modifications are those in which the size and especially the widths of the trays are varied. In light of these and other apparent modifications, the scope of the present invention should be interpreted solely from the followiong claims, as such claims are read in light of the disclosure.

What is claimed is:

1. A generally elongated avionic tray adapted to be substituted for a prior art avionic tray formed of sheet aluminum with a predetermined thickness, the tray arranged to be mounted on a pair of cross-channels provided in an aircraft, said tray has means for holding a box containing electronic instruments, a bottom section of the avionic tray holding a gasket and an air flow metering plate and forming a portion of an upper boundary of an air plenum into which air is drawn, the avionic tray comprising:

a bottom section of unitary construction from aluminum alloy sheet having a thickness less than said predetermined thickness and having a plurality of corrugations in the aluminum alloy sheet, each corrugation comprising a portion of the sheet wherein the material of the sheet on one side of the corrugation is offset relative to the material on the other side, said corrugations offsetting the material of the sheet less than the thickness of the sheet, said bottom section portion of said sheet and said corrugations combined thickness being about the same thickness as said predetermined thickness and a pair of side rails of unitary construction with the bottom section, each one of the side rails being formed of aluminum alloy sheet having a thickness less than said predetermined thickness and having at least one corrugation in the sheet, the at least one corrugation comprising a portion of the sheet wherein the material of the sheet on one side is offset relative to the material on the other side, said corrugation offsetting the material of the sheet less than the thickness of the sheet, said side rail portion of said sheet and said corrugations combined thickness being about the same thickness as said predetermined thickness, the said rails extending upwardly at lateral edges of the bottom section.

2. The avionic tray of claim 1 wherein the aluminum alloy sheet is aluminum alloy of 6061-T6 designation.

3. The avionic tray of claim 1 wherein the aluminum alloy sheet of the tray is approximately 0.040" thick.

4. The avionic tray of claim 3 wherein the offsets increase the apparent thickness of the aluminum alloy sheet of the tray to approximately 0.063".

5. The avionic tray of claim 1 wherein the bottom section is substantially flat and includes a depressed portion forming a rim around an aperture, said aperture receiving a gasket and said gasket receiving a metering plate for metered passage of circulating air through the bottom section of the tray.

6. The avionic tray of claim 1 wherein the corrugations of the bottom section are substantially parallel with the general longitudinal axis of the tray.

7. The avionic tray of claim 6 wherein there are a plurality of corrugations in the aluminum alloy sheet of each of the side rails.

8. The avionic tray of claim 7 wherein the corrugations in the aluminum alloy sheet of the side rails include corrugations which are inclined relative to the general longitudinal axis of the tray.

9. The avionic tray of claim 1 further comprising a back plate secured between the side rails, and wherein the side rails include a plurality of jig pins formed in the side rails and a plurality of jig holes formed in the back plate, the jig pins and the jig holes jointly forming means for aligning the back plate in vertical position relative to the bottom section.

10. The avionic tray of claim 9 wherein the jig pins comprise a punched out portion of the sheet-metal of the side rail, the punched out portion including a circular hole and a rim surrounding the hole.

11. A generally elongated avionic tray adapted to be substituted for a prior art avionic tray formed of sheet aluminum with a thickness of about 0.063", the tray arranged to be mounted on a pair of cross-channels provided in an aircraft, said tray has means for holding a box containing electronic instruments, a bottom section of the avionic tray holding a gasket and an air flow metering plate and forming a portion of an upper boundary of an air plenum into which air is drawn, the avionic tray comprising:

an elongated bottom section which includes a depression rimming a hole, the depression receiving the gasket and the metering plate secured by the gasket, and a pair of side rails disposed vertically relative to the bottom section at lateral edges of the bottom section, the bottom section and the side rails being of unitary construction from an aluminum alloy sheet having a thickness of about 0.040" with beads spaced intermittently in said sheet, each of the beads comprising a portion of the aluminum alloy sheet where the material of the sheet on one side of the bead is offset relative to the material on the other side of the bead, the beads increasing the rigidity and structural strength of the aluminum alloy sheet and the beads and sheet combined thickness being about 0.063".

12. The avionic tray of claim 11 wherein the beads in the bottom section of the tray are disposed substantially parallel with the longitudinal axis of the tray.

13. The avionic tray of claim 12 wherein the substantially parallel beads in the bottom section of the tray are spaced no further than approximately 0.6" from one another.

14. The avionic tray of claim 12 wherein the beads in the side rails of the tray include beads disposed inclined relative to the longitudinal axis of the tray.

15. The avionic tray of claim 12 wherein the depression in the bottom section of the tray is free of beads.

16. The avionic tray of claim 12 wherein the tray is made from aluminum alloy having the designation 6061.

17. In an avionic tray adapted to replace prior art avionic trays formed of sheet aluminum having a thickness of about 0.063", the tray arranged to be mounted in an aricraft, said tray having means for holding a box containing electronic instruments, a bottom section of the avionic tray forming a portion of an upper boundary of an air plenum into which air is drawn, the avionic tray including an elongated bottom section which includes a depression rimming a hole, the depression receiving a gasket and a metering plate secured by the gasket, and a pair of side rails disposed vertically relative to the bottom section at lateral edges of the bottom section, the bottom section and the side rails being of unitary construction from an aluminum alloy sheet, the improvement comprising:

the aluminum alloy sheet at least in the bottom section thereof having a thickness of about 0.040" and beads formed therein, the beads comprising offsets of the aluminum alloy material of the sheet in a vertical direction, the beads and sheet combined thickness being about 0.063", said tray having a decreased weight compared to the prior art trays and a load bearing capacity comparable to the prior art trays.

18. The improvement of claim 17 wherein the aluminum sheet of each of the side rails has a thickness of about 0.040" and a plurality of beads comprising an offset of the aluminum alloy material of the sheet and providing a combined bead and rail thickness of about 0.063".

19. The improvement of claim 18 wherein the depression in the bottom section is free of beads.

20. The improvement of claim 19 wherein in the bottom section the beads are disposed substantially parallel with the longitudinal axis of the tray.

21. The improvement of claim 20 wherein the side rails include beads disposed at an acute angle relative to the longitudinal axis of the tray.

* * * * *

UNITED STATES PATENT AND TRADEMARK OFFICE
CERTIFICATE OF CORRECTION

PATENT NO. : 4,766,517
DATED : August 23, 1988
INVENTOR(S) : Robert H. Abell

It is certified that error appears in the above—identified patent and that said Letters Patent is hereby corrected as shown below:

Column 3, line 12, "cross-sectinal" should read
  --cross-sectional--.
Column 3, line 52, "of" should read --or--.
Column 3, line 60, "2" should read --20--.
Column 6, line 6, after "which" insert --abuts the rear edge
  of the bottom of the back plate 26 and thereby--.

Signed and Sealed this

Twenty-first Day of February, 1989

Attest:

DONALD J. QUIGG

Attesting Officer

Commissioner of Patents and Trademarks